(12) United States Patent
Willmeroth

(10) Patent No.: US 10,276,655 B2
(45) Date of Patent: Apr. 30, 2019

(54) SEMICONDUCTOR DEVICES AND METHODS FOR FORMING A SEMICONDUCTOR DEVICE

(71) Applicant: Infineon Technologies Austria AG, Villach (AT)

(72) Inventor: Armin Willmeroth, Friedberg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/602,564

(22) Filed: May 23, 2017

(65) Prior Publication Data

US 2017/0345893 A1 Nov. 30, 2017

(30) Foreign Application Priority Data

May 27, 2016 (DE) .................. 10 2016 109 774

(51) Int. Cl.
| | |
|---|---|
| *H01L 29/78* | (2006.01) |
| *H01L 29/06* | (2006.01) |
| *H01L 29/66* | (2006.01) |
| *H01L 29/861* | (2006.01) |

(52) U.S. Cl.
CPC ...... *H01L 29/0634* (2013.01); *H01L 29/6609* (2013.01); *H01L 29/66666* (2013.01); *H01L 29/7827* (2013.01); *H01L 29/861* (2013.01)

(58) Field of Classification Search
CPC ............. H01L 29/7813; H01L 29/0696; H01L 29/1095; H01L 29/7805; H01L 29/407
See application file for complete search history.

(56) References Cited

U.S. PATENT DOCUMENTS

| | | | |
|---|---|---|---|
| 5,216,275 A | 6/1993 | Chen | |
| 6,630,698 B1 | 10/2003 | Deboy et al. | |
| 6,639,272 B2 | 10/2003 | Ahlers et al. | |
| 2006/0284248 A1 | 12/2006 | Saito et al. | |
| 2007/0272953 A1* | 11/2007 | Hirler | ............... H01L 29/0634 257/285 |

FOREIGN PATENT DOCUMENTS

| | | |
|---|---|---|
| DE | 10100802 C1 | 8/2002 |
| DE | 102013112831 A1 | 7/2014 |
| DE | 102014101847 A1 | 8/2014 |

* cited by examiner

*Primary Examiner* — Trang Q Tran
(74) *Attorney, Agent, or Firm* — Murphy, Bilak & Homiller, PLLC

(57) ABSTRACT

A semiconductor device includes a plurality of compensation regions of a first conductivity type arranged in a semiconductor substrate. The semiconductor device further includes a plurality of drift region portions of a drift region of a vertical electrical element arrangement. The drift region has a second conductivity type. The drift region portions and the compensation regions are arranged alternatingly. At least portions of a border of a depletion region occurring in a static blocking state of the vertical electrical element arrangement are located within the drift region portions at a depth of less than a depth of at least a subset of the compensation regions.

19 Claims, 12 Drawing Sheets

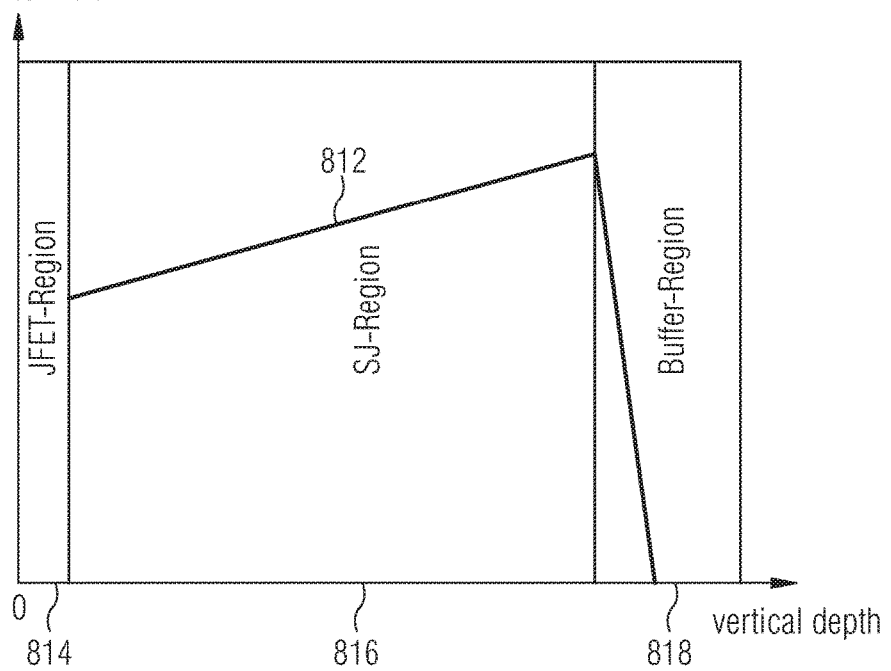

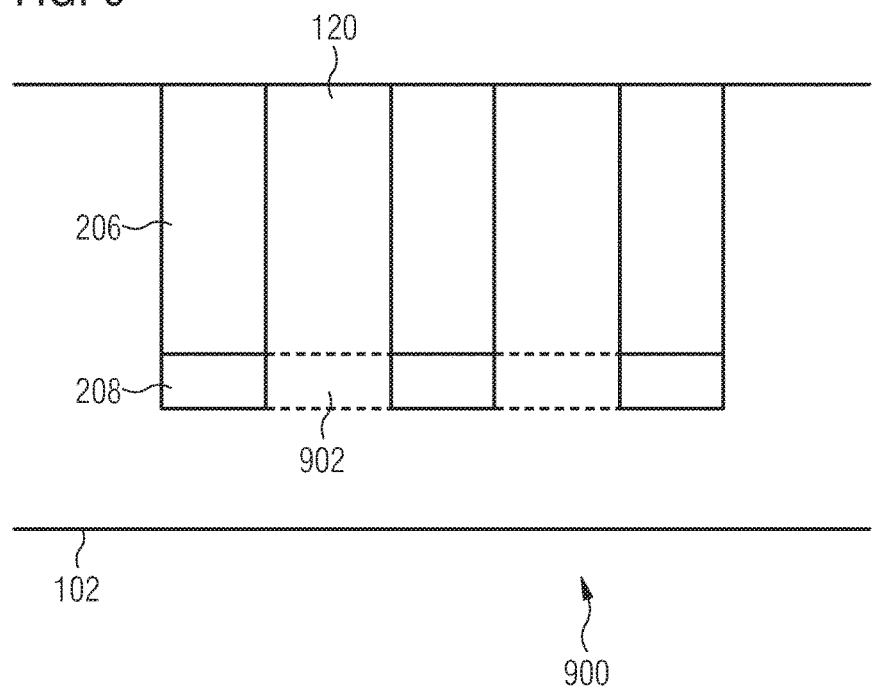

SEMICONDUCTOR DEVICES AND METHODS FOR FORMING A SEMICONDUCTOR DEVICE

TECHNICAL FIELD

Embodiments relate to concepts for super junction or compensation devices and in particular to semiconductor devices and methods for forming semiconductor devices.

BACKGROUND

Achieving a low on-resistance is desired in the development of efficient and highly blocking power transistors. For example, the on-resistance leads to a loss incurred through a load on the transistor. Having a reduced on-resistance enables the usage of such transistors in high load-scenarios, as a loss due to the on-resistance is reduced.

SUMMARY

There may be a demand to provide an improved concept for semiconductor devices, which enables a reduction of the on-resistance.

Some embodiments relate to a semiconductor device comprising a plurality of compensation regions of a first conductivity type arranged in a semiconductor substrate. The semiconductor device further comprises a plurality of drift region portions of a drift region of a vertical electrical element arrangement. The drift region comprises a second conductivity type. The drift region portions and the compensation regions are arranged alternatingly. At least portions of a border of a depletion region occurring in a static blocking state of the vertical electrical element arrangement are located within the drift region portions at a depth of less than a depth of at least a subset of the compensation regions.

Some embodiments relate to a semiconductor device comprising a plurality of compensation regions of a first conductivity type arranged in a semiconductor substrate. The semiconductor device further comprises a plurality of drift region portions of a drift region of a vertical electrical element arrangement. The drift region comprises a second conductivity type. The drift region portions and the compensation regions are arranged alternatingly. At least two of the compensation regions comprise an upper compensation region portion and a buffer compensation region portion. The drift region comprises a buffer portion located laterally between the buffer compensation region portions of the at least two compensation regions. Half of a laterally summed number of dopants of the buffer compensation region portions of the at least two compensation regions is lower than 80% of a laterally summed number of dopants of the buffer portion.

Some embodiments relate to a method for forming a semiconductor device, the method comprises forming a plurality of compensation regions of a first conductivity type arranged in a semiconductor substrate. The method further comprises forming a plurality of drift region portions of a drift region of a vertical electrical element arrangement is arranged in the semiconductor substrate. The drift region comprises a second conductivity type. The drift region portions and the compensation regions are arranged alternatingly. At least portions of a border of a depletion region occurring in a static blocking state of the vertical electrical element arrangement are located within the drift region portions at a depth of less than a depth of at least a subset of the compensation regions.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 8a and 8b show respective profiles of electric fields of different semiconductor devices.

FIG. 9 shows a schematic cross section of a semiconductor device.

DETAILED DESCRIPTION

Figure 1:
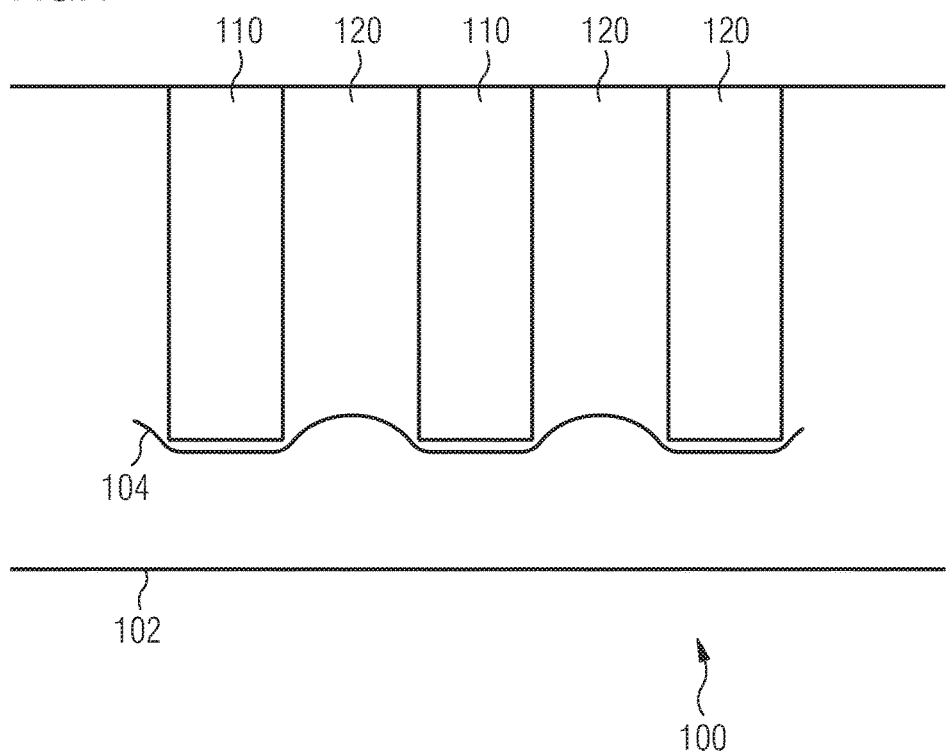
FIG. 1 shows a schematic cross section of a semiconductor device.

Various example embodiments will now be described more fully with reference to the accompanying drawings in which some example embodiments are illustrated. In the figures, the thicknesses of lines, layers and/or regions may be exaggerated. for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

A significant parameter for an efficient, highly blocking power transistor is the lowest possible, specific on-resistance $R_{on} \cdot A$. There are numerous parameters, which may improve the dynamic characteristics, particularly those optimizing the output and feedback capacitances. Nevertheless, the on-resistance continues to be one of the most important parameters.

Areas, which contribute appreciably to the on-resistance, may be the Junction Field Effect Transistor (JFET) region (the area between the body areas), the actual Super Junction (SJ) area and the buffer region, for example. In case of a highly blocking transistor, contact areas, channel area and substrate might only make minor contributions to the $R_{on} \cdot A$.

The buffer region may be important for the robustness of the transistors in case of cosmic radiation events and in case of overload operation while maintaining high current and high voltage levels at the same time. In some SJ transistors, the on-resistance of the buffer region contributes a sizeable share of the overall on-resistance, for example.

For example, the on-resistance proportion in the buffer region may amount to 20% to 30% of the overall on-resistance.

To further develop the transistors, width and distance (each in lateral direction) of the compensation areas may be reduced ("shrink"), and at the same time the doping level of the p- and n-compensation areas may be increased. In this way, the conductivity of the compensation region may be increased while maintaining the blocking capability.

However, the buffer region, which may be unavoidable (to manufacture robust transistors), might not be improved in this way. The proportion of the buffer region in the overall resistance may increase with each shrink, for example. For example, the on-resistance cannot be lowered below the resistance of the buffer region, something that may limit the further development of SJ transistors. It may be desired to reduce the resistance of the buffer region.

FIG. 1 shows a schematic cross section of a semiconductor device 100 according to an embodiment. The semiconductor device 100 comprises a plurality of compensation regions 110 arranged in a semiconductor substrate 102. The compensation regions 110 of the plurality of compensation regions 110 comprise a first conductivity type. The semiconductor device 100 further comprises a plurality of drift region portions 120 of a drift region of a vertical electrical element arrangement. The drift region comprises a second conductivity type. Drift region portions 120 of the plurality of drift region portions 120 and compensation regions 110 of the plurality of compensation regions 110 are arranged alternatingly. At least portions of a border 104 of a depletion region occurring in a static blocking state (e.g. applying the maximum blocking voltage, not only 20% of this voltage) of the vertical electrical element arrangement are located within the drift region portions 120 at a depth of less than a depth of at least a subset of the compensation regions 110 of the plurality of compensation regions 110.

A buffer layer (located between compensation regions and the highly doped substrate) may be formed with additional compensation regions. A surplus of n-doping the second conductivity type) may remain unchanged in comparison to buffer layers of other devices.

Portions of the border of the depletion region occurring in a static blocking state may be located at a lower depth than the depth of compensation regions due to a just partial compensation of the drift region portions at a bottom region of the compensation regions. In this way, a part of the drift region portions at the bottom region of the compensation regions is not depleted in the blocking state and may be effective as buffer region, although the doping concentration within this region is increased, for example. Therefore, the on-resistance of the vertical electrical element arrangement may be reduced, while the robustness of the semiconductor device may be high.

In the blocking state of the vertical electrical element arrangement, a large depletion region arises due to the alternating arrangement of n- and p-doped regions. A border 104 of the depletion region arises in proximity of the bottom regions of the compensation regions 110. A course of the border 110 of the depletion region depends on a doping concentration distribution within the compensation regions 110 and within the drift region. For example, the border 104 of the depletion region runs at a larger depth than a depth of the compensation regions 110 below the compensation regions 110 and runs up to a depth of less than the depth of at least a subset of the compensation regions 110. The border 104 of the depletion region may be located within the drift region and may comprise a wavy or wavelike profile in a lateral direction. For example, the portions of the border of the depletion region closest to the front-side surface of the semiconductor substrate 102 may be located between two neighboring compensation regions of the subset of compensation regions.

In the blocking state of the vertical electrical element arrangement, a maximal operating voltage to be blocked by the vertical electrical element arrangement occurs at the vertical electrical element arrangement. In contrast, a very low voltage drop over the vertical electrical element arrangement occurs in an on-state of the vertical electrical element arrangement due to the low on-resistance of the vertical electrical element arrangement. A current flow through the vertical electrical element arrangement in the on-state is orders of magnitude (e.g. more than 3, 4 or 5 orders of magnitude) higher than a leakage current in the blocking state. For example, the blocking state is a static blocking state, if the maximal operating voltage is applied to the vertical electrical element arrangement for more than 1 ms (or more than 10 ms or more than 100 ms), In contrast, a dynamic blocking state occurs, if the vertical electrical element arrangement is switched fast.

The subset of the compensation regions 110 may include every second (e.g. FIG. 4 or 5), every third or every n-th compensation region (n being an integer) of the plurality of compensation regions and/or may include the compensation regions located within a cell region of the semiconductor substrate 102 of the semiconductor device 100, for example. At least the subset of the compensation regions 110 comprises a depth of more than the depth of portions of a border of a depletion region. Alternatively, all compensation regions 110 of the plurality of compensation regions 110 comprise a depth of more than the depth of portions of a border of a depletion region. In other words: the compensation regions in the SJ-region may have a different periodicity than the lower compensation regions in the buffer-region.

For example, each compensation region of at least the subset of compensation regions may comprise a buffer compensation region portion (lower compensation region portion) and an upper compensation region portion located closer to a front-side surface of the semiconductor substrate than the buffer compensation region portion. Implementing compensation regions with different compensation region portions may enable achieving different compensation effects, e.g. for super junction regions and buffer regions. Using the buffer compensation region portions to achieve a compensation effect in a portion of the drift region portions (e.g. the buffer region or portion of the buffer region) may enable a higher net doping of the buffer region of the vertical electrical element arrangement.

Portions of the drift region located laterally between the buffer compensation region portions of at least the subset of compensation regions may be called buffer portions of the drift region. The portions of a border 104 of the depletion region occurring in the static blocking state located at a depth of less than the depth of at least the subset of the compensation regions may be located within the buffer portions.

The buffer compensation region portions may extend vertically from a bottom of the compensation region at least to a level of a portion of the border of the depletion region closest to a front-side surface of the semiconductor substrate between two neighboring compensation regions of the subset of compensation regions, for example. For example, a vertical dimension or extension of the buffer compensation region portions of at least the subset of compensation regions is larger than 3 µm (or larger than 5 µm or larger than 10 µm). For example, a buffer region or a part of a buffer region of the drift region may be located laterally between the buffer compensation region portions of neighboring compensation regions 110 of at least the subset of compensation regions. Portions of the drift region located laterally between neighboring upper compensation region portions (e.g. upper compensation region portions of neighboring compensation regions) may correspond to a super junction portion of the drift region, and portions of the drift region located. laterally between neighboring buffer compensation region portions (e.g. buffer compensation region portions of neighboring compensation regions) may correspond to buffer region portions.

Compensation structures or super junction structures may be based on mutual compensation of at least a part of the charge of n- and p-doped areas in the drift region. For example, in a vertical transistor, p-and n-stripes (drift region portions and compensation regions) may be arranged in pairs in a cross section of the semiconductor substrate. For example, the upper compensation region portions may comprise a laterally summed number of dopants per unit area of the first conductivity type deviating from a laterally summed number of dopants per unit area of the second conductivity type comprised by the drift region portions located laterally between upper compensation region portions of neighboring compensation regions by less than +/−20% of the laterally summed number of dopants per unit area of the first conductivity type comprised by upper compensation region portions within a cell region of the semiconductor device.

A degree of compensation k may be defined as $k=2\cdot(n-p)/(n+p)$, with n and p being the laterally summed number of n/p dopants per unit area. An absolute degree of compensation K may be defined as $K=|k|$.

For example, at least a vertical portion (e.g. the upper compensation region portion) of a compensation region 110 of the plurality of compensation regions 110 comprises a laterally summed number of dopants per unit area (e.g. dopants laterally summed over the whole width of the compensation region at an unit area) of the first conductivity type deviating from half of a laterally summed number of dopants per unit area of the second conductivity type comprised by two drift region portions 120 located adjacent to opposite sides of the portion of the (e.g. stripe-shaped) compensation region by less than +/−20% (or less than +/−15%, less than +/−10%, less than +/−5%, less than 2% or less than 1%) of the laterally summed number of dopants per unit area of the first conductivity type comprised by the compensation region. For example, a degree of compensation of at least a vertical portion (e.g. the upper compensation region portion) of a compensation region 110 of the plurality of compensation regions 110 and half of two drift region portions 120 located adjacent to opposite sides of the portion of the (e.g. stripe-shaped) compensation region may be less than +/−20% (or less than 15%, or less than 10%, or less than 5%). The lateral summed number of dopants per unit area and/or the degree of compensation may be substantially constant for the vertical portion of the compensation region or may vary for different depths. The lateral summed number of dopants per unit area may be equal or nearly equal to a number of free charge carriers within the vertical portion of a compensation region 110 or a drift region portion 120 to be compensated in a particular depth of the vertical portion, for example. The unit area may be a two-dimensional area oriented orthogonal to the direction of summing (e.g. along width of compensation region). The unit area may be an area of 1 µm·1 µm or 100 nm·100 nm or 10 nm·10 nm, for example.

For example, half of a laterally summed number of dopants of the upper compensation region portions of neighboring compensation regions may differ from a laterally summed number of dopants of a portion of the drift region located laterally between the upper compensation region portions of the neighboring compensation regions by less than 20% (or less than 10% or less than 5%) of the laterally summed number of dopants of the portion of the drift region. The upper compensation region portions enable a higher blocking voltage in a reverse voltage state as charge carriers are removed while maintaining a low on resistance in an on-state. For example, a doping concentration of the upper compensation regions and a doping concentration of portions of the drift region located laterally between upper compensation region portions of neighboring compensation regions may be between $1*10^{16}$ cm$^{-3}$ and $1*10^{17}$ cm$^{-3}$ (or between $2*10^{16}$ cm$^{-3}$ and $5*10^{16}$ cm$^{-3}$), for example. The upper compensation region portions of the compensation regions and the parts of the drift region portions located laterally between the upper compensation region portions of the compensation regions may represent a configuration layer of semiconductor device (e.g. super junction device or compensation device).

For example, half of a laterally summed number of dopants of the buffer compensation region portions of two compensation regions may be lower than 95% (or lower than 90%, lower than 80%, lower than 50%, lower than 20%, lower than 10% or lower than 5%) of a laterally summed number of dopants of a buffer portion of the drift region located laterally between the buffer compensation region portions of the two compensation regions. The buffer compensation region portions may enable a partial compensation of an adjacent part of drift region portions enable a higher effective doping concentration of buffer portions of the drift region portions located laterally adjacent to the buffer compensation region portions.

For example, a (maximal or average) doping concentration of (e.g. the whole or at least a part of) a buffer portion of the drift region located laterally between the buffer compensation region portions may differ by less than 20% of the doping concentration of the buffer portion (or less than less than 10%, less than 5% or less than 1%) from a (maximal or average) doping concentration of a part of a drift region portion located laterally between upper compensation region portions of neighboring compensation regions. The absolute degree of compensation in the buffer region (portion) may be smaller than 20% (or smaller than 10%, smaller than 5%, smaller than 1%). In this way, an implantation of the doping of the buffer portions and the rest of the drift region portions using similar implantation concentrations may be enabled.

Alternatively or additionally, a doping concentration of a part of a drift region portion located laterally between upper compensation region portions of neighboring compensation regions may be at least 20% of the doping concentration of the buffer portion (or less than less than 10%, less than 5% or less than 1%) higher than a doping concentration of (e.g. the whole or another part of) the buffer portion of the drift region located laterally between the buffer compensation region portions.

For example, a doping concentration within the buffer compensation region portions may be lower than 80% (or lower than 50%, lower than 20%, lower than 10% or lower than 5%) of a doping concentration within the upper compensation region portions. The doping concentration within the buffer compensation region portions being lower than the doping concentration within the upper compensation region portions may result in an incomplete compensation of buffer portions located laterally between buffer compensation region portions so that at least a part of the buffer portions is not depleted in the blocking state, which may increase the robustness of the semiconductor device 100, for example.

For example, the drift region may further comprise a buffer layer portion located vertically between the plurality of compensation regions (110) and a back-side surface of the semiconductor substrate. The buffer layer portion may be a layer extending at least along a cell region of the semiconductor substrate 102 below bottoms of compensation regions of at least the subset of compensation regions (e.g. adjacent to the bottoms). The doping concentration of the buffer layer portion may be less than 80% (or lower than 50%, lower than 10% or lower than 5%) of a doping concentration of a part of a drift region portion located laterally between upper compensation region portions of neighboring compensation regions. For example, a doping concentration within the buffer layer portion in an edge termination region may be more than 10% (or 20% or 50%) lower than a doping concentration of the buffer layer portion in the cell region of the semiconductor substrate 102, for example.

The semiconductor substrate 102 may comprise a cell region laterally surrounded by an edge termination region. The cell region may be a region of the semiconductor substrate 102 used to conduct more than 90% of a current through the semiconductor substrate 102 in an on-state or conducting state of the vertical electrical element arrangement. The edge termination region may be located between an edge of the semiconductor substrate 102 and the cell region in order to support or block or reduce or dissipate a maximal voltage applied between the front side surface of the semiconductor substrate 102 and a back side surface of the semiconductor substrate 102 within the cell region laterally towards the edge of the semiconductor substrate 102. For example, the plurality of drift region portions 120 of the drift region of the vertical electrical element arrangement is arranged within the cell region of the semiconductor substrate 102 of the semiconductor device 100.

The plurality of compensation regions 110 may be stripe-shaped (e.g. pillar-shaped or column-shaped in a cross section) compensation regions and the plurality of drift region portions 120 may be stripe-shaped drift region portions. A stripe-shape may be a geometry extending in a first lateral direction significantly farther than in an orthogonal second lateral direction. For example, the compensation regions of the plurality of compensation regions and/or the drift region portions 120 of the drift region may comprise a lateral length of more than 10× (or more than 50× or more than 100×) a lateral width of the compensation regions of the plurality of compensation regions 110 and/or the plurality of drift region portions 120. For example, the lateral length of a compensation region 110 and/or a drift region portion 120 may be the largest lateral extension of the compensation region 110 and/or the drift region portion 120 and the lateral width of a compensation region 110 and/or a drift region portion 120 may be a shortest lateral dimension of the compensation region and/or the drift region portion. For example, the plurality of compensation regions 110 and/or the plurality of drift region portions 120 may comprise a vertical extension larger than the lateral width and shorter than the lateral length. For example, the plurality of compensation regions 110 may extend into a depth of more than 10 μm (or more than 30 μm or more than 50 μm). For example, a number of drift region portions 120 and a number of compensation region 110 arranged alternatingly is larger than 50 (or larger than 100 or larger than 500).

For example, the upper compensation region portions and the buffer compensation region portions may be stripe-shaped. The upper compensation region portions and the buffer compensation region portions may extend along the same lateral direction, for example. Alternatively, the upper compensation region portions may extend along a first lateral direction and the buffer compensation region portions may extend along a second lateral direction being different from the first lateral direction, for example. The first lateral direction and the second lateral direction may be substantially orthogonal directions, for example. Using compensation layer portions having different lateral directions may increase a flexibility of an implementation. For example, the buffer compensation region portions may have a larger periodicity than the upper compensation regions, allowing larger layer thickness in the buffer region, than in the compensation region. For example, the portions of the compensation areas located laterally adjacent to the buffer portions (e.g. the buffer compensation region portions) may comprise a different orientation than those of the configuration layer (e.g. the upper compensation region portions), e.g., stripes rotated by 90°.

A region comprising the first conductivity type may be a p-doped region (e.g. caused by incorporating aluminum ions or boron ions) or an n-doped region e.g. caused by incorporating nitrogen ions, phosphor ions or arsenic ions). Consequently, the second conductivity type indicates an opposite n-doped region or p-doped region. In other words, the first conductivity type may indicate a p-doping and the second conductivity type may indicate an n-doping or vice-versa.

The semiconductor substrate 102 of the semiconductor device 100 may be a silicon substrate. Alternatively, the semiconductor substrate 102 may be a wide band gap semiconductor substrate having a band gap larger than the band gap of silicon (1.1eV). For example, the semiconductor substrate 102 may be a silicon carbide (SiC)-based semiconductor substrate, or gallium arsenide (GaAs)-based semiconductor substrate, or a gallium nitride (GaN)-based semiconductor substrate. The semiconductor substrate 102 may be a semiconductor wafer or a semiconductor die.

For example, the vertical direction and a. vertical dimension or thicknesses of layers may be measured orthogonal to a front side surface of the semiconductor substrate 102 and a lateral direction and lateral dimensions may be measured in parallel to the front side surface of the semiconductor substrate 102.

For example, the vertical electrical element arrangement of the semiconductor device and/or the whole semiconductor device may comprise a blocking voltage of more than 10V, e.g. more than 20V, more than 50V, for example. The semiconductor device 100 may be a power semiconductor device. A power semiconductor device and/or the vertical electrical element arrangement (e.g. transistor structure or diode structure) of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

For example, the vertical electrical element arrangement may be an electrical structure enabling a vertical current flow through the semiconductor substrate 102 in a conductive state or on-state of the vertical electrical element arrangement. The vertical electrical element arrangement may be a vertical diode arrangement or a vertical transistor arrangement (e.g. a metal-oxide-semiconductor field effect transistor or insulated-gate-bipolar transistor).

For example, at least the vertical electrical element arrangement (e.g. a vertical diode arrangement or a vertical transistor arrangement) of the semiconductor device 100 is a compensation or super junction structure enabling a control and/or conduct and/or block a current flow between the front side of the semiconductor device and a backside of the semiconductor device. For example, the vertical electrical element arrangement is a vertical field effect transistor arrangement. In this example, the vertical electrical element arrangement may comprise one or more source regions, one or more body regions and one or more gates controlling a current between the one or more source regions and the drift region portion 120 through the one or more body regions. A source electrode structure may be electrically connected (ohmic) to the one or more source regions at the front side of the semiconductor substrate 102 and to a source contact interface (e.g. source pad) of the semiconductor device. Additionally, the source electrode structure may be electrically connected (ohmic) to the one or more body regions. Furthermore, the source electrode structure may be electrically connected (ohmic) to the plurality of compensation regions. Additionally, the vertical field effect transistor arrangement may comprise a gate electrode structure electrically connected (ohmic) to the one or more gates of the vertical field effect transistor arrangement. The vertical electrical element arrangement comprises drift region portions 120 and compensation regions 110 arranged alternatingly in at least one lateral direction within a cell region of the semiconductor substrate.

Figure 2:
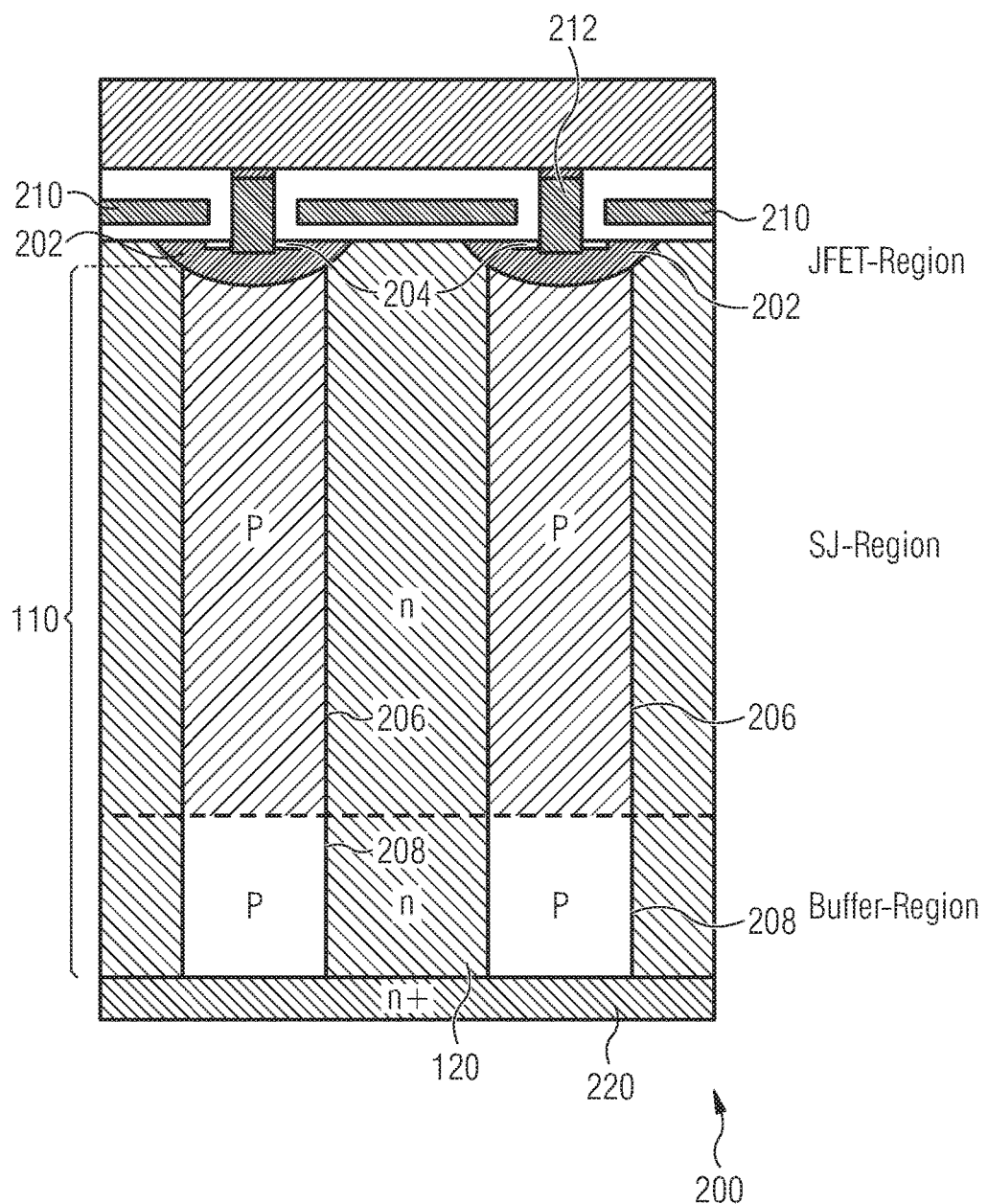
FIG. 2 shows a schematic cross section of a semiconductor device comprising upper compensation region portions and buffer compensation region portions.

FIG. 2 illustrates a schematic illustration of a semiconductor device 200 having a vertical transistor arrangement according to an embodiment. The semiconductor device 200 may be implemented similar to the semiconductor device described in connection with FIG. 1. The semiconductor device 200 comprises a plurality of body regions 202 of the vertical transistor arrangement. The plurality of body regions comprise a p-doping (e.g. with a doping concentration between $2*10^{16}$ cm$^{-3}$ and $1*10^{18}$ cm$^{-3}$ and reach into depth between 1 µm and 3 µm), for example. The plurality of compensation regions 110 extend from the plurality of body regions 202 into the semiconductor substrate. Further, the semiconductor device 200 comprises a plurality of source regions 204 of the vertical transistor arrangement, The plurality of source regions comprise an n-doping (e.g. with a doping concentration of more than $1*10^{19}$ cm$^{-3}$ or above $5*10^{19}$ cm$^{-3}$). The plurality of source regions 204 and the plurality of body regions 202 are electrically connected to a source wiring structure (e.g. using a common source contact 212). Further, the semiconductor device 200 comprises a plurality of gate electrodes 210 of the vertical transistor arrangement. Additionally, the semiconductor device 200 comprises a drain doping region 220 (e.g. highly n-doped, n$^+$) located at a back side of the semiconductor substrate. Using the buffer compensation region portions to achieve a partial compensation effect in the buffer region enables a higher net doping of the buffer portions of the buffer region of the vertical transistor arrangement. FIG. 2 further shows a division of the drift region in a JFET-region, a SJ-region and a buffer region, FIG. 2 further shows the upper compensation region portions 206 and the buffer compensation region portions 208 of the compensation regions 110.

For example, the compensation in the buffer region (portions of the buffer region located laterally between neighboring buffer compensation region portions) may be set such that an excess of n-doping is set so that the "net doping" (e.g., the concentration of n-doping atoms minus the concentration of p-doping atoms) roughly corresponds to an n-dopant concentration between $1*10^{15}$ cm$^{-3}$ and $1*10^{16}$ cm$^{-3}$ (or between $3*10^{15}$ cm$^{-3}$ and $6*10^{15}$ cm$^{-3}$), which may be a typical doping concentration of a buffer region without implemented compensation regions.

For example, the buffer region (e.g. including buffer portions and a buffer layer) or buffer portions of the buffer region may comprise a thickness (vertical dimension) between 5 µm and 50 µm (or between 10 µm and 30 µm).

More details and aspects of the semiconductor device 200 are mentioned in connection with the proposed concept or one or more examples described above or below. The semiconductor device 200 may comprise one or more additional optional features corresponding to one or more aspects of the proposed concept or one or more examples described above (e.g. FIGS. 1) or below (e.g. FIGS. 3-11).

Figure 3:
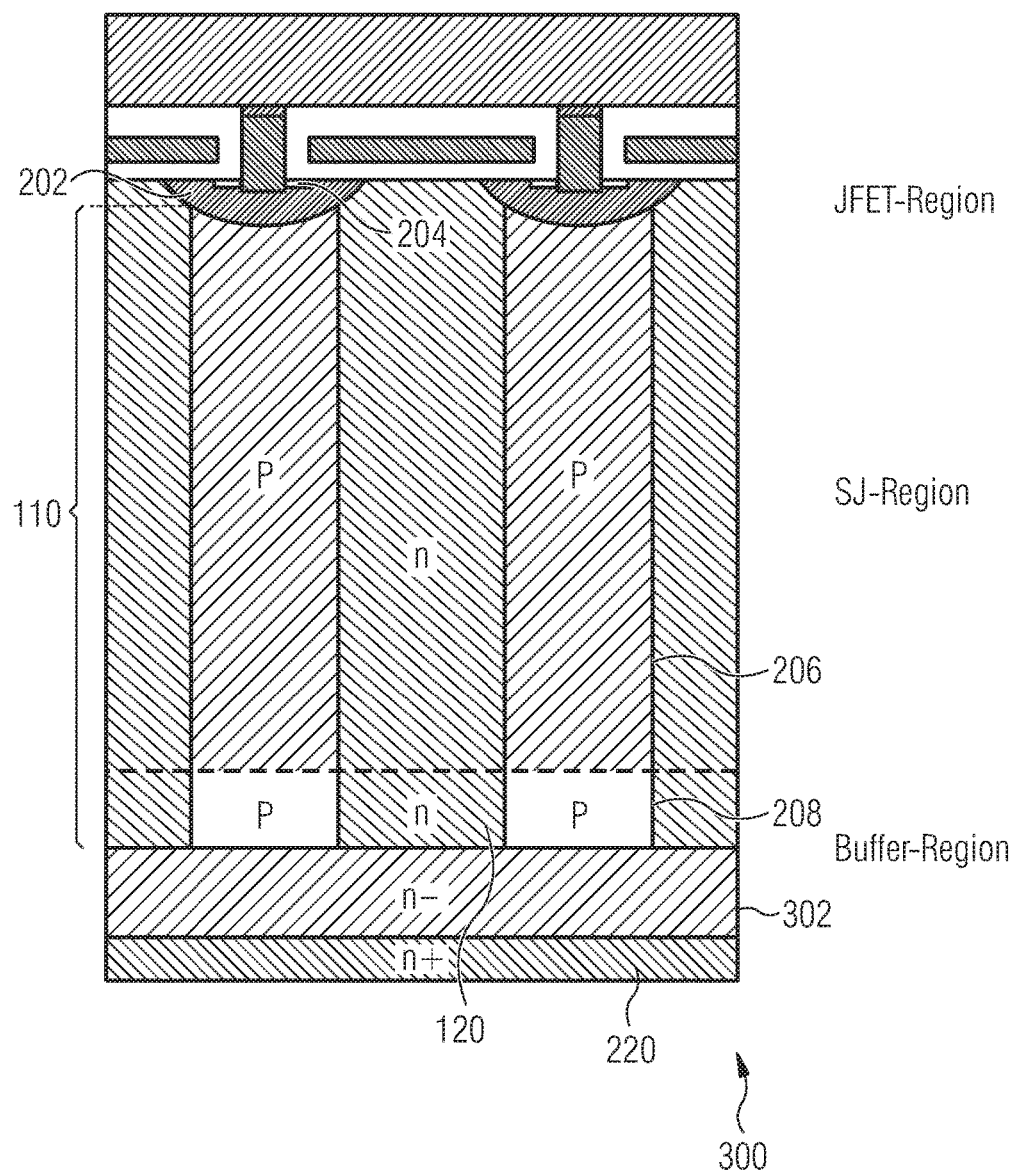
FIG. 3 shows a schmatic cross section of a semiconductor device comprising a buffer layer portion.

FIG. 3 illustrates a schematic illustration of a semiconductor device 300 according to an embodiment. The semiconductor device 300 may be implemented similar to the semiconductor device shown in FIG. 1 and/or 2. The drift region further comprises a buffer layer portion 302 (e.g. a buffer layer) located vertically between the plurality of compensation regions 110 and a back-side surface of the semiconductor substrate (e.g. below the plurality of compensation regions 110). The buffer layer (buffer region) comprises two layers of different dopant concentration (e.g. the buffer region portions located between buffer compensation region portions of neighboring compensation regions and the buffer layer portion). For example, both layers of the buffer region may be replaced with Si regions. Alternatively, only one layer (e.g. the upper layer (the buffer region portions located between buffer compensation region portions of neighboring compensation regions) as it is less heavily doped and has a higher on-resistance proportion) might be replaced. The buffer layer portion may comprise an average doping concentration between $1*10^{15}$ cm$^{-3}$ and $1*10^6$ cm$^{-3}$ (or between $3*10^{15}$ cm$^{-3}$ and $6*10^5$ cm$^{-3}$). Having an additional buffer layer portion may further increase the robustness of the semiconductor device 300.

A (average or maximal) doping concentration within the buffer layer portion might differ by less than 20% (or less than 10% or less than 5%) from a difference between a (average or maximal) doping concentration of the buffer compensation region portions and a (average or maximal) doping concentration of the buffer portion located laterally between the buffer compensation region portions, for example.

The buffer layer portion 302 may extend laterally along the whole cell region of the vertical electrical element arrangement. An average doping concentration of the buffer region or buffer layer may be less than 50% of an average doping concentration of at least a part the drift region portions 120 located between upper compensation region portions of neighboring compensation regions, for example.

More details and aspects of the semiconductor device 300 are mentioned in connection with the proposed concept or one or more examples described above or below. The semiconductor device 300 may comprise one or more additional optional features corresponding to one or more aspects of the proposed concept or one or more examples described above (e.g. FIGS. 1-2) or below (e.g. FIGS. 4-11).

Figure 4:
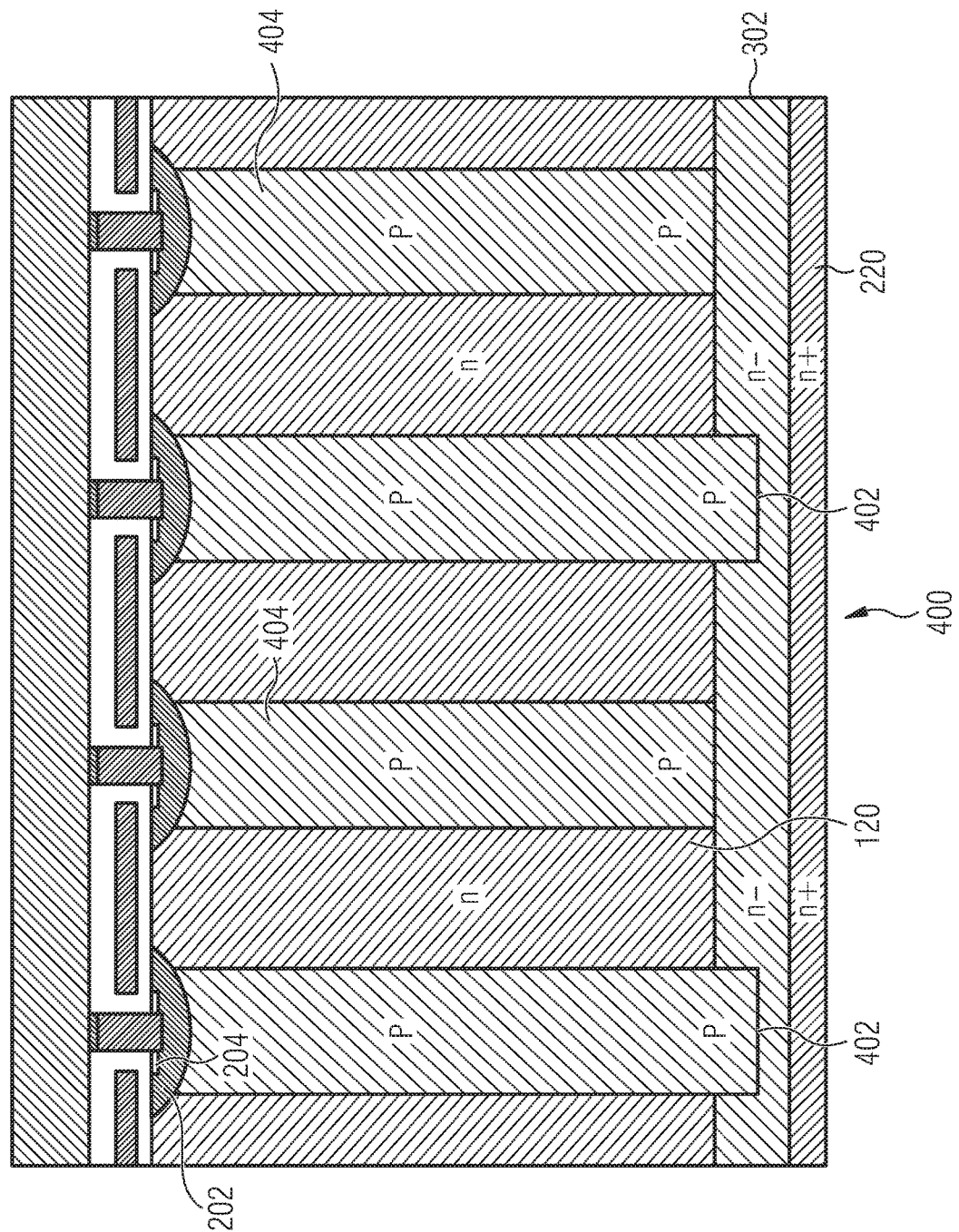
FIG. 4 shows a schematic cross section of a semiconductor device comprising compensation regions of varying length.

FIG. 4 illustrates a schematic illustration of a semiconductor device 400 according to an embodiment. The semiconductor device 400 may be implemented similar to the semiconductor devices shown in FIG. 1, 2 or 3. The plurality of compensation regions 110 comprises a first subset 404 of compensation regions and a second subset 402 of compensation regions, for example. The compensation regions 110 of the second subset 402 of compensation regions comprise upper compensation region portions and buffer compensation region portions, for example. A depth of the compensation regions of the first subset 404 of compensation regions may be lower than 95% lower than 90% or lower than 80%) of a depth of compensation regions of the second subset 402 of compensation regions, for example. The second subset 402 of compensation regions comprises every second compensation region in this example. For example, buffer portions may be located between buffer compensation region portions of the second subset 402 of compensation regions.

The depth of the plurality of compensation regions has a lateral variation. For example, cells are shown underneath which the buffer compensation areas (buffer compensation region portions) go deeper into the buffer than underneath other cells. In this way, $R_{on} \cdot A$ may be improved in dynamically non-critical regions of the device, while the protective function may be improved in critical areas.

More details and aspects of the semiconductor device 400 are mentioned in connection with the proposed concept or one or more examples described above or below.

The semiconductor device 400 may comprise one or more additional optional features corresponding to one or more aspects of the proposed concept or one or more examples described above (e.g. FIGS. 1-3) or below (e.g. FIGS. 5-11).

Figure 5:
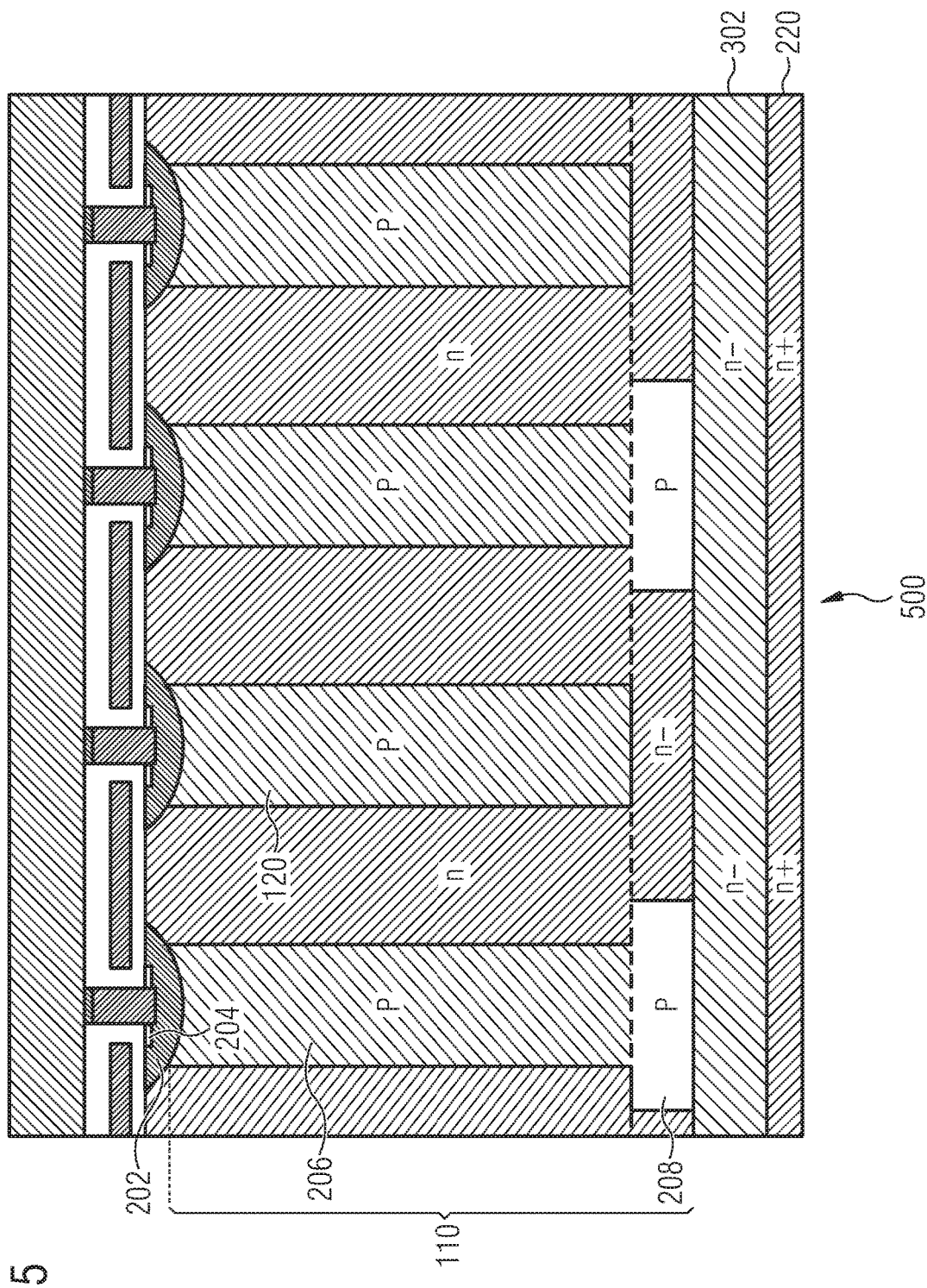
FIG. 5 shows a schematic cross section of a semiconductor device comprising upper compensation region portions and buffer compensation region portions having a different periodicity than the upper compensation layer portions.

FIG. 5 illustrates a schematic illustration of a semiconductor device 500 according to an embodiment, in which the compensation areas (compensation regions) of the buffer region (buffer compensation region portions) comprise another width than those of the configuration layers (upper compensation region portions). The semiconductor device 500 may be implemented similar to the semiconductor devices shown in FIG. 3, for example. A lateral width of the buffer compensation region portions 208 is at least 20% (or at least 50% or at least 80%) larger than a lateral width of the upper compensation region portions 206, for example. Super junction areas of the buffer region (buffer compensation region portions) may comprise a different periodicity than those of the configuration layer (compensation regions of the plurality of compensation regions), for example. For example, every second, every third or every n-th compensation region of the plurality of compensation regions in a lateral direction may comprise a lower compensation region. This may be used if the buffer region is built up using thicker layers, which may require a correspondingly higher temperature budget. If a greater pitch in the buffer region is selected, the compensation areas may be widened in a first diffusion step following the completion of this region. Thus, the buffer may be manufactured using a higher temperature budget than the configuration layer.

More details and aspects of the semiconductor device 500 are mentioned in connection with the proposed concept or one or more examples described above or below. The semiconductor device 500 may comprise one or more additional optional features corresponding to one or more aspects of the proposed concept or one or more examples described above (e.g. FIGS. 1-4) or below (e.g. FIGS. 6-11).

Figure 6:
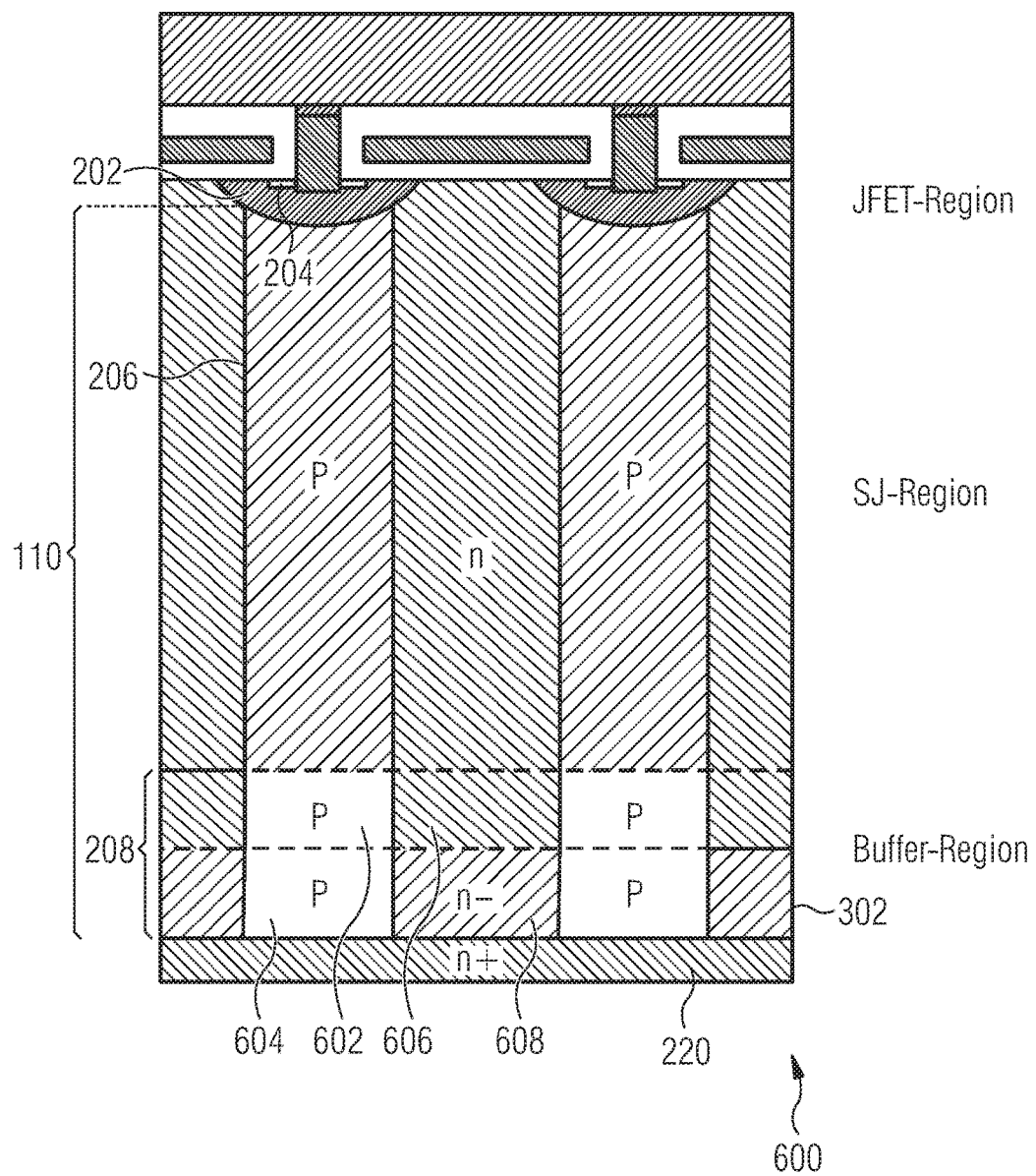
FIG. 6 shows a schematic cross section of a semiconductor device comprising buffer compensation region portions with first and second sub-portions.

FIG. 6 shows an embodiment of a semiconductor device 600 according to an embodiment, in which the buffer region comprises two layers of different dopant concentration. The semiconductor device 600 may be implemented similar to the semiconductor devices shown in FIG. 3 or 4, for example. In FIG. 6, both layers are replaced with super junction areas. The lower one of the two layers may have a higher excess of n-doping, for example.

For example, each buffer compensation region portion 208 (of at least the subset of compensation regions) comprises a first compensation sub-portion 602 and a second compensation sub-portion 604. Each buffer portion comprises a first buffer sub-portion 606 located laterally between the first compensation sub-portions 602 of the two compensation regions 110 and a second buffer sub-portion 608 located laterally between the second compensation sub-portions 604 of the two compensation regions 110. Having multiple sub-portions of the buffer compensation region portion may enable a finer granularity of adjustment and an additional degree of freedom in the design.

For example, first compensation sub-portions and first buffer sub-portions may constitute a first buffer region layer, and second compensation sub-portions and second buffer sub-portions may constitute a second buffer region layer. The first buffer region layer and the second buffer region layer may be manufactured using different technologies or parameters, for example.

The first compensation sub-portion 602 is located closer to a front-side surface of the semiconductor substrate 102 than the second compensation sub-portion 604, for example. Further, the first buffer sub-portion 606 is located closer to a front-side surface of the semiconductor substrate 102 than the second buffer sub-portion 608, for example.

A doping concentration of the first compensation sub-portion 602 may be at least 20% (or at least 30% higher, or at least 50%) higher than a doping concentration of the second compensation sub-portion 604. Alternatively or additionally, a doping concentration of the first buffer sub-portion 606 may be at least 20% (or at least 30% higher, or at least 50%) higher than a doping concentration of the second buffer sub-portion 608.

For example, half of a laterally summed number of dopants of the first compensation sub-portions 602 of the two compensation regions may be lower than 80% (or lower than 50% or lower than 10%) of a laterally summed number of dopants of the first buffer sub-portion 606.

Additionally or alternatively, half of a laterally summed number of dopants of the second compensation sub-portions 604 of the two compensation regions may be lower than 80% (or lower than 50% or lower than 10%) of a laterally summed number of dopants of the second buffer sub-portion 606.

More details and aspects of the semiconductor device 600 are mentioned in connection with the proposed concept or one or more examples described above or below. The semiconductor device 600 may comprise one or more additional optional features corresponding to one or more aspects of the proposed concept or one or more examples described above (e.g. FIGS. 1-5) or below (e.g. FIGS. 7-11).

In some embodiments, the buffer region may be defined as a super junction region. For example, as a manufacturing process, the same technique may be used (for the buffer compensation region portion) as for the set-up of the actual SJ region (upper compensation region portion). In this case, only a larger number of epitaxial layers including their respective lithographic and implantation steps may be required.

Figure 7:
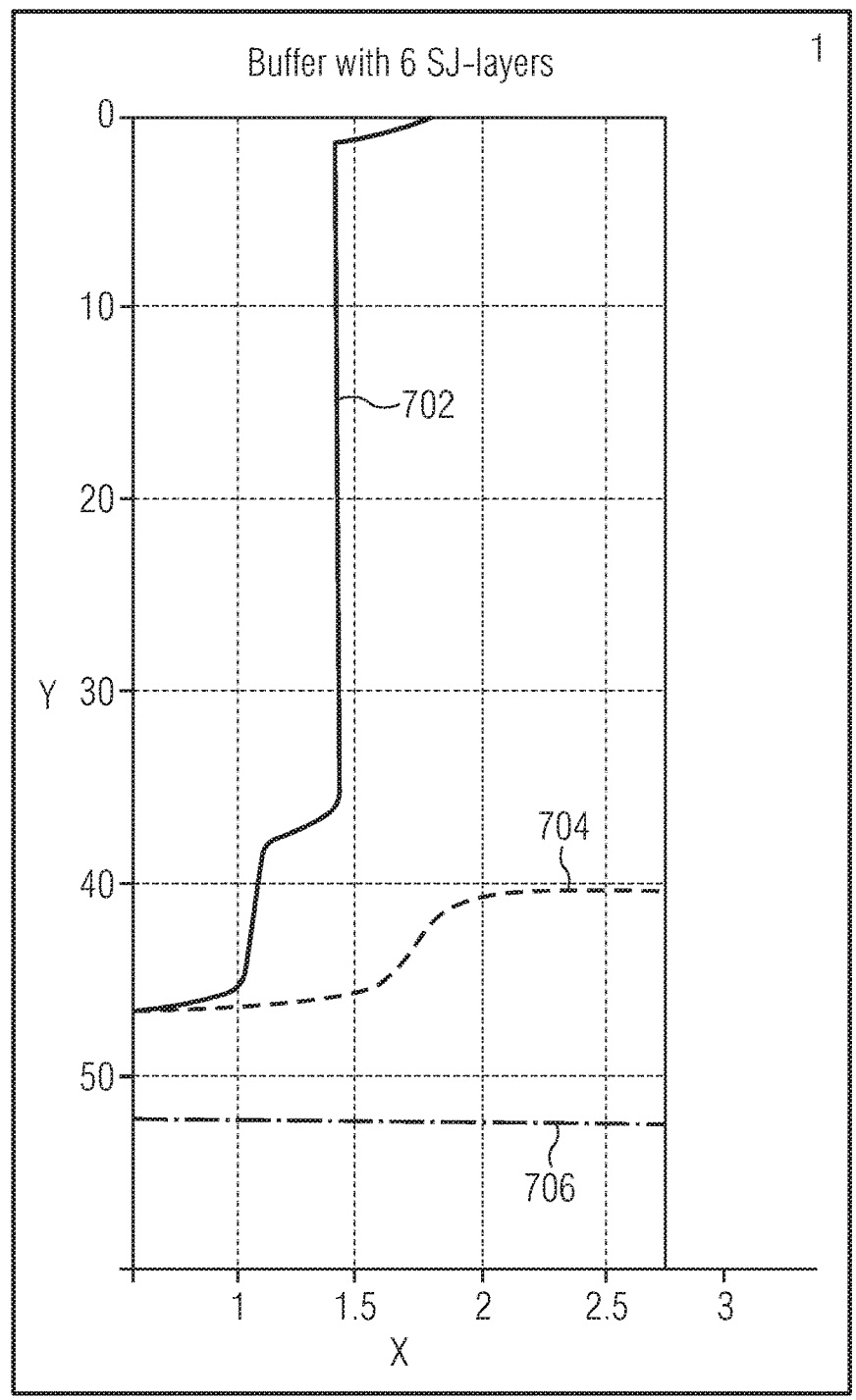
FIG. 7 shows a cross section of semiconductor device, illustrating a border of a depletion region and a p-n junction of the semiconductor device.

Using the suggested structure, the resistance of the buffer layer may also be reduced in case of a shrink of the technology, so that the concept may become increasingly attractive when the width of the structure decreases, particularly as the number of epitaxial levels may further increase when the width of the structure decreases. Therefore, the effort to be made for several additional levels may become less significant. As shown in FIGS. 7 and 8, simulations illustrate the functionality of an aspect of the proposed concept. For example, the increased manufacturing costs of the buffer may result in a significantly improved $R_{on} \cdot A$.

For example, to test the functionality, the buffer region used by the other device was replaced with a super junction region by way of trial in the simulation for a super-junction MOSFET device. A reference structure comprises 12 layers of around 3 µm thickness each, and a two-part buffer region with 10 µm having a doping of $3*10^{15}$ cm$^{-3}$ and 8 µm having a doping of $6*10^{15}$ cm$^{-3}$.

FIG. 7 shows a schematic illustration of a semiconductor device 700 according to an embodiment. A vertical axis of the semiconductor substrate (y-axis) is plotted versus a lateral axis of a part of the semiconductor substrate. The buffer region was formed using 6 layers each having a thickness of 3 µm. The n-doping was selected as done in the configuration layer (at a depth of the upper compensation region portions), the p-doping had 60% of the value of the configuration layer in the upper three layers (the first sub-portion of the lower compensation region) and 10% of this value in the lower three layers (the second sub-portion of the lower compensation region). This selection may result in a net doping concentration, which may roughly correspond to the doping of a buffer region of other devices. FIG. 7 further shows the p-n junction 702 between compensation region and drift region, the border of the depletion region 704 and a drain doping region 706.

Figure 8A:
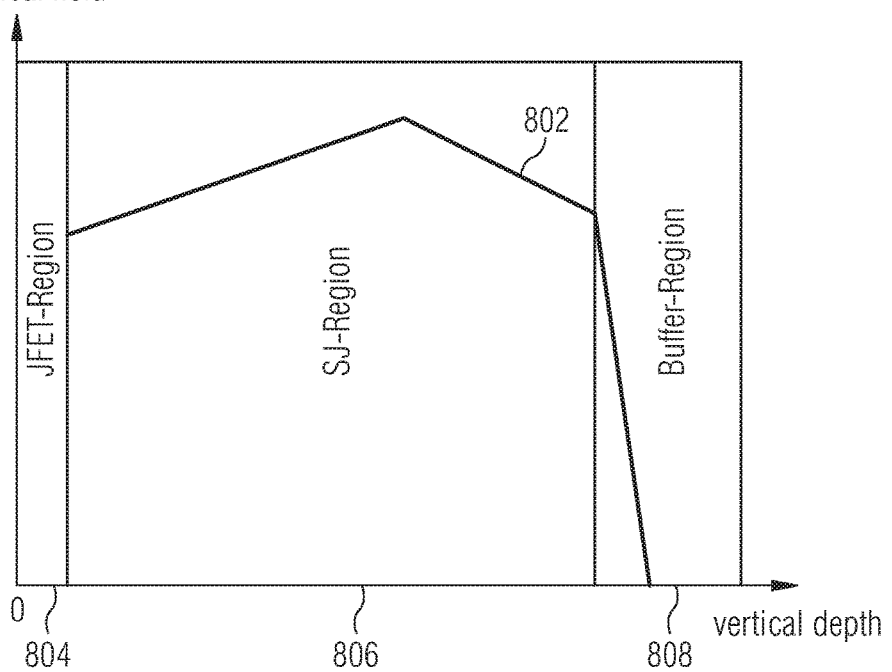

FIG. 8a shows a profile 802 of the electric field produced by an embodiment of a semiconductor device in a JFET-region 804, in a Super-Junction (SJ)-region 806 (region located between two adjacent upper compensation region portions) and in a buffer region 808 (a region located between two adjacent buffer compensation region portions). The x-axis shows a vertical depth and the y-axis shows a strength of the electrical field. In this embodiment, a doping concentration of the upper compensation region portion differs between an upper end of the upper compensation region (lower p-doping concentration) and a lower end of the upper compensation region (higher p-doping concentration). At the bend of the profile 802 within the SJ-region, the p-doping concentration of the upper compensation region portion may match an n-doping concentration of an adjacent n-doping drift region portion.

FIG. 8b shows a profile 812 of the electric field of an embodiment of a. semiconductor device in a JFET-region 814, in a Super-Junction (SJ)-region 816 and in a buffer region 818. The x-axis shows a vertical depth and the y-axis shows a strength of the electrical field. In this embodiment, a doping concentration of the upper compensation region portion may be substantially constant.

Another aspect of the suggested structure may be that, by differently setting the degree of compensation within the buffer region (6 layers in case of the above simulation), it may be possible to adjust the doping profile to the dynamic requirements in a flexible manner. It may be possible for the breakdown voltage of the transistor to be increased without compromising the dynamic characteristics.

FIG. 9 shows a schematic cross section of a semiconductor device 900 according to an embodiment. The semiconductor device 900 comprises a plurality of compensation regions arranged in a semiconductor substrate 102. The compensation regions of the plurality of compensation regions comprise a first conductivity type. The semiconductor device further comprises a plurality of drift region portions 120 of a drift region of a vertical electrical element arrangement. The drift region comprises a second conductivity type. Drift region portions 120 of the plurality of drift region portions 120 and compensation regions of the plurality of compensation regions are arranged alternatingly. At least two compensation regions of the plurality of compensation regions comprise an upper compensation region portion 206 and a buffer compensation region portion 208. The drift region comprises a buffer portion 902 located laterally between the buffer compensation region portions 208 of the two compensation regions. Half of a laterally summed number of dopants of the buffer compensation region portions 208 of the two compensation regions is lower than 80% of a laterally summed number of dopants of the buffer portion 902.

By selecting the number of dopant within the buffer region higher than in the adjacent halves of the lower portions of the compensation regions, a part of the drift region portions at the bottom region of the compensation regions is not depleted in the blocking state and may be effective as buffer region, although the doping concentration within this region is increased, for example. Therefore, the on-resistance of the vertical electrical element arrangement may be reduced, while the robustness of the semiconductor device may be high.

The laterally summed number of dopants may correspond to a number of dopants within a vertically delimited portion of the compensation region and/or the drift region portion. For example, the laterally summed number of dopants may correspond to a. number of dopants within the width of the compensation region drift region portion and within a pre-defined vertical (and a pre-defined third dimensional) extent. The laterally summed number of dopants may correspond to a laterally summed number of dopants per unit area, for example.

More details and aspects of the semiconductor device 900 are mentioned in connection with the proposed concept or one or more examples described above (e.g. FIG. 1) or below. The semiconductor device 900 may comprise one or more additional optional features corresponding to one or more aspects of the proposed concept or one or more examples described above or below (e.g. FIGS. 10-11).

Figure 10:
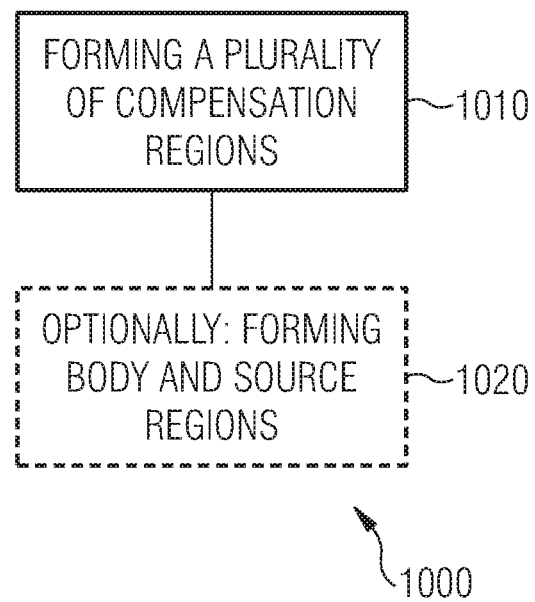
FIG. 10 shows a flow chart of a method for forming a semiconductor device.

FIG. 10 illustrates a block diagram of a method 1000 for forming a semiconductor device. The method 1000 comprises forming 1010 a plurality of compensation regions arranged in a semiconductor substrate. The compensation regions of the plurality of compensation regions comprise a first conductivity type. A plurality of drift region portions of a drift region of a vertical electrical element arrangement is arranged in the semiconductor substrate. The drift region comprises a second conductivity type. Drift region portions of the plurality of drift region portions and compensation regions of the plurality of compensation regions are arranged alternatingly. At least portions of a border of a depletion region occurring in a static blocking state of the vertical electrical element arrangement are located within the drift region portions at a depth of less than a depth of at least a subset of the compensation regions of the plurality of compensation regions.

For example, the forming 1010 of the plurality of compensation regions may comprise forming of buffer compensation region portions of the plurality of compensation regions and forming of upper compensation region portions of the plurality of compensation regions. The forming of the upper and/or lower compensation regions portions may be based on using a trench process, e.g. using trench etching and filling with doped silicon or using trench etching and a subsequent doping of e.g. a side wall of the trench and filling of the trench with non-doped filling material. Alternatively or additionally, the forming of the upper and/or lower compensation regions portions may he based on a multi-epitaxy process (e.g. epitaxial deposition of a semiconductor layer, lithography, implantation (e.g. multiple times), which may be repeated. The upper compensation region portions and the buffer compensation region portions may be formed using different processes, for example.

The vertical electrical element arrangement may correspond to a vertical transistor arrangement. Optionally, the method 1000 may further comprise forming 1020 body and source regions of the vertical transistor arrangement.

More details and aspects of the method 1000 are mentioned in connection with the proposed concept or one or more examples described above or below. The method 1000 may comprise one or more additional optional features corresponding to one or more aspects of the proposed concept or one or more examples described above (e.g. FIGS. 1-9) or below (e.g. FIG. 11).

Figure 11:
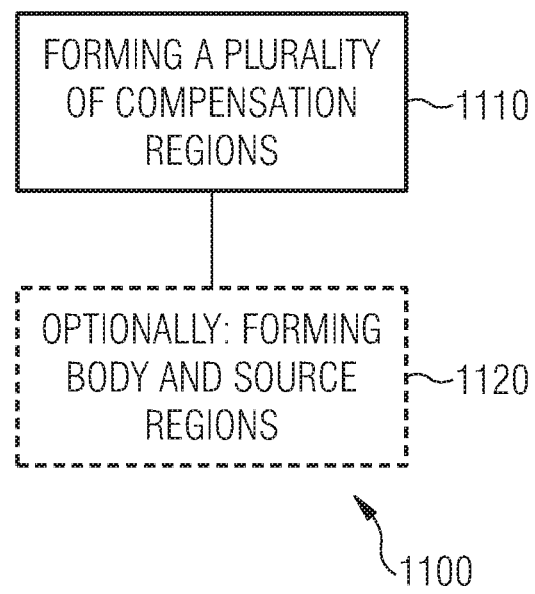
FIG. 11 shows a flow chart of a method for forming another semiconductor device.

FIG. 11 illustrates a flow chart of a method 1100 for forming a semiconductor device. The method 1100 comprises forming 1110 a plurality of compensation regions arranged in a semiconductor substrate. The compensation regions of the plurality of compensation regions comprise a first conductivity type. A plurality of drift region portions of a drift region of a vertical electrical element arrangement is arranged in the semiconductor substrate. The drift region comprises a second conductivity type. Drift region portions of the plurality of drift region portions and compensation regions of the plurality of compensation regions are arranged alternatingly. At least two compensation regions of the plurality of compensation regions comprise an upper compensation region portion and a buffer compensation region portion. The drift region comprises a buffer portion located laterally between the buffer compensation region portions of the two compensation regions. Half of a laterally summed number of dopants of the buffer compensation region portions of the two compensation regions is lower than 80% of a laterally summed number of dopants of the buffer portion.

The vertical electrical element arrangement may correspond to a vertical transistor arrangement. Optionally, the method 1100 may further comprise forming 1120 body and source regions of the vertical transistor arrangement.

More details and aspects of the method 1100 are mentioned in connection with the proposed concept or one or more examples described above or below. The method 1100 may comprise one or more additional optional features corresponding to one or more aspects of the proposed concept or one or more examples described above (e.g. FIGS. 1-10) or below.

Other methods for forming semiconductor devices may comprise depositing a medium-doped buffer region of a second conductivity type, forming a plurality of compensation regions (e.g. using a multi-epi (epitaxy)-process) and forming body and source regions.

Figure 12:
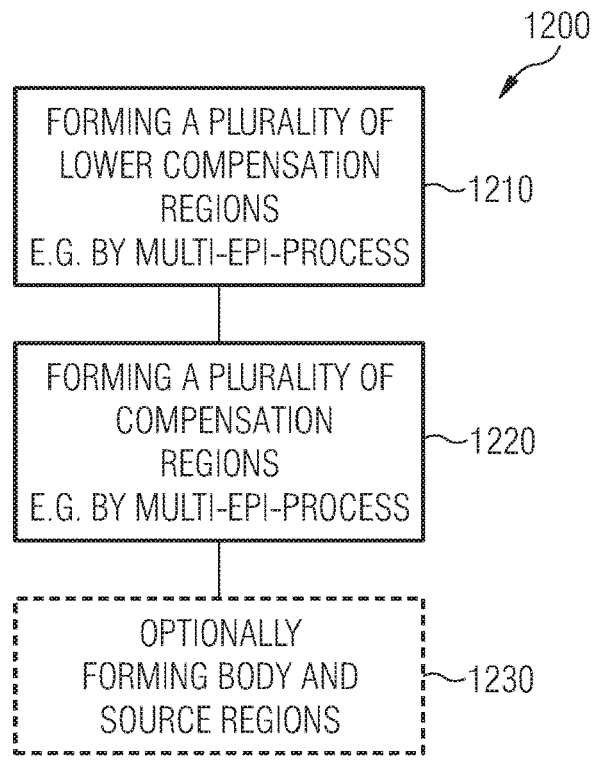
FIG. 12 shows a flow chart of a method for forming a semiconductor device.

FIG. 12 illustrates a flow chart of an embodiment of a method 1200 for forming a semiconductor device. The method 1200 comprises forming 1210 a plurality of lower compensation regions (e.g. buffer compensation region portions), e.g. using a multi-epi-process. The method 1200 further comprises forming 1220 a plurality of compensation regions (e.g. a plurality of upper compensation region portions), e.g. using a multi-epi-process. The method 1200 may further optionally comprise forming 1230 body and source regions.

More details and aspects of the method 1200 are mentioned in connection with the proposed concept or one or more examples described above or below. The method 1200 may comprise one or more additional optional features corresponding to one or more aspects of the proposed concept or one or more examples described above e.g. FIGS. 1-11) or below.

Other methods for forming semiconductor devices may comprise depositing a medium-doped buffer region of a second conductivity type, forming a plurality of compensation regions (e.g. using a. trench process) and forming body and source regions.

Figure 13:
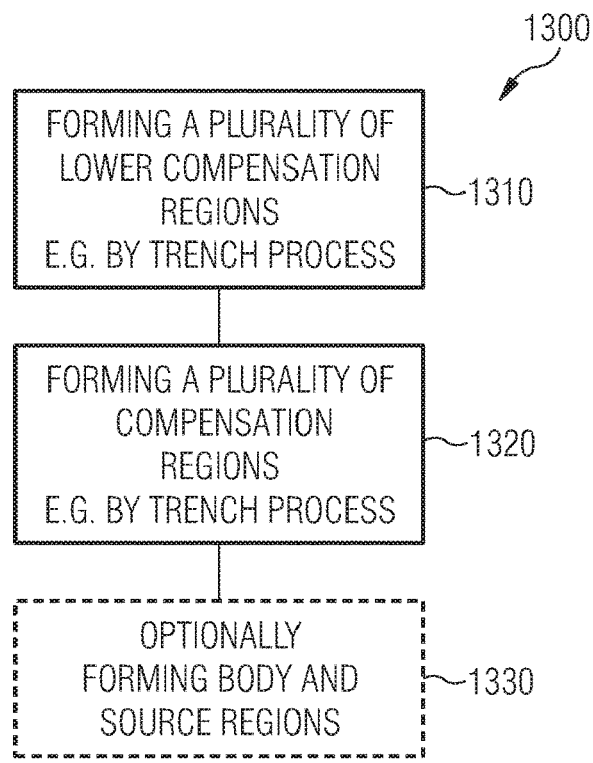
FIG. 13 shows a flow chart of a method for forming a semiconductor device.

FIG. 13 illustrates a flow chart of an embodiment of a method 1300 for forming a semiconductor device. The method 1300 comprises forming 1310 a plurality of lower compensation regions (e.g. buffer compensation region portions), e.g. using a trench process. The method 1300 further comprises forming 1320 a plurality of compensation regions (e.g. a plurality of upper compensation region portions), e.g. using a trench process. The method 1300 may further optionally comprise forming 1330 body and source regions.

More details and aspects of the method 1300 are mentioned in connection with the proposed concept or one or more examples described above or below. The method 1300 may comprise one or more additional optional features corresponding to one or more aspects of the proposed concept or one or more examples described above (e.g. FIGS. 1-12) or below.

At least some embodiments may be based on designing the buffer region as a super junction region. The buffer region of a. super junction transistor, which may be designed as a doped layer in some systems, may be designed as a super junction area as well. In this way, the resistance of the buffer region may be reduced in case of a shrink of the technology, which might not be possible using another design of the buffer region. At least some embodiments may relate to a CoolMOS (Superjunction Metal-Oxide-Semiconductor) with an improved buffer.

For making the distinction between the upper compensation layer portions and the lower compensation layer portions, the net doping may be used as both the conventional buffer (e.g. located below the bottom of the compensation regions) and the buffer regions located between buffer compensation region portions of neighboring compensation regions may require a clear excess of n-doping. Thus, embodiments may comprise a structure in which the lower layers (buffer portion of the drill region located laterally between the buffer compensation region portions) (at least one, but there may be several) may comprise a clear excess of n-doping, e.g., 20% to 50% more n-doping (e.g. summed compensation region portions of neighboring compensation regions and buffer portions of the drift region located laterally between the buffer compensation region portions). For example, a strongly n-dominant layer in the lower super-junction region may be implemented.

According to an aspect, the lowest p-compensation area in the buffer region may adjoin the substrate, but may also be spaced. As the compensation in this region may be designed using a very strong excess of n-doping, the vertical electric fields (in case of a static load) may be very low so that the fact that the p-areas adjoins the substrate may be acceptable.

For example, the compensation areas in the buffer (the buffer compensation region portions) may be generated using a different manufacturing method than for the compensation areas of the actual (voltage-absorbing) layer (upper compensation region portion), for example. The buffer (e.g. the buffer compensation region portions) may be generated using trench technology, and the configuration layer (upper compensation region portions) may be generated using multi-epitaxy.

According to an aspect, the compensation areas of the buffer region may comprise a different orientation than those of the configuration layers, e.g., stripes rotated by 90°.

For example, the compensation areas of the buffer region may comprise a different geometry than those of the configuration layers, e.g., cells in the buffer and stripes in the configuration layer.

According to an aspect, the compensation areas of the buffer region may comprise another width than those of the configuration layers.

For example, the net doping may vary monotonously (n-excess increasing towards the bottom); however, further towards the bottom, there may also be incorporated layers having less n-excess (or even p-excess)

According to an aspect, the doping level of the buffer region may be higher or lower than the level in the configuration layer.

For example, the net doping of the buffer layer may vary laterally. For example, a different doping may be set in the cell field than in the edge area of the transistor.

For example, underneath a gate pad of the semiconductor device, a different doping level may be set than in the cell field. Less dynamic loads might arise underneath the gate pad (e.g., no short). It may be difficult to achieve the same blocking capability underneath the gate pad as in the cell field. Therefore, blocking capability may be obtained here using a less heavily n-oriented/doped buffer (buffer region portion).

According to an aspect, the transition areas between cell field and edge may also comprise a different dopant level than the cell field, which may be adjusted to the particular dynamic processes of this transition area.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that - although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a. particular order unless such acts or functions are not interchangeable for technical reasons. Furthermore, in some embodiments a single act may include or may be broken into multiple sub acts. Such sub acts may be included and part of the disclosure of this single act unless explicitly excluded.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a plurality of compensation regions of a first conductivity type arranged in a semiconductor substrate; and
   a plurality of drift region portions of a drift region of a vertical electrical element arrangement, the drift region comprising a second conductivity type,
   wherein the drift region portions and the compensation regions are arranged alternatingly,
   wherein at least portions of a border of a depletion region occurring in a static blocking state of the vertical electrical element arrangement are located within the drift region portions at a depth of less than a depth of at least a subset of the compensation regions,
   wherein each compensation region comprises a buffer compensation region portion and an upper compensation region portion located closer to a front-side surface of the semiconductor substrate than the buffer compensation region portion,
   wherein the buffer compensation region portions extend vertically from a bottom of the compensation regions to at least a level of a portion of the border of the depletion region closest to a front-side surface of the semiconductor substrate between two neighboring compensation regions of the subset of compensation regions,
   wherein a doping concentration within the buffer compensation region portions is lower than 80% of a doping concentration within the upper compensation region portions.

2. The semiconductor device of claim 1, wherein half of a laterally summed number of dopants of the buffer compensation region portions of two compensation regions is lower than 95% of a laterally summed number of dopants of a buffer portion of the drift region located laterally between the buffer compensation region portions of the two compensation regions.

3. The semiconductor device of claim 1, wherein a lateral width of the buffer compensation region portions is at least 20% larger than a lateral width of the upper compensation region portions.

4. The semiconductor device of claim 1, wherein the upper compensation region portions and the buffer compensation region portions are stripe-shaped, and wherein the upper compensation region portions extend along a first lateral direction and the buffer compensation region portions extend along a second lateral direction being different from the first lateral direction.

5. The semiconductor device of claim 1, wherein the buffer compensation region portion comprises a first compensation sub-portion and a second compensation sub-portion, wherein the buffer portion comprises a first buffer sub-portion located between the first compensation sub-portions of the two compensation regions and a second buffer sub-portion located between the second compensation sub-portions of the two compensation regions, and wherein a doping concentration of the first compensation sub-portion is at least 20% higher than a doping concentration of the second compensation sub-portion or a doping concentration of the first buffer sub-portion is at least 20% higher than a doping concentration of the second buffer sub-portion.

6. The semiconductor device of claim 1, wherein a doping concentration of a buffer portion of the drift region located laterally between the buffer compensation region portions differs by less than 20% from a doping concentration of a part of a drift region portion located laterally between upper compensation region portions of neighboring compensation regions.

7. The semiconductor device of claim 1, wherein half of a laterally summed number of dopants of the upper compensation region portions of neighboring compensation regions differs from a laterally summed number of dopants of a portion of the drift region located laterally between the upper compensation region portions of the neighboring compensation regions by less than 20% of the laterally summed number of dopants of the portion of the drift region.

8. The semiconductor device of claim 1, wherein a doping concentration of the upper compensation regions and a doping concentration of portions of the drift region located laterally between upper compensation region portions of neighboring compensation regions is between $1*10^{16}$ cm$^{-3}$ and $1*10^{17}$ cm$^{-3}$.

9. The semiconductor device of claim 1, wherein the plurality of compensation regions comprises a first subset of compensation regions and a second subset of compensation regions, wherein a depth of the compensation regions of the first subset of compensation regions is lower than 95% of a depth of compensation regions of the second subset of compensation regions.

10. The semiconductor device of claim 1, wherein the compensation regions of the plurality of compensation regions are stripe-shaped compensation regions and the drift region portions of the plurality of drift region portions are stripe-shaped drift region portions.

11. The semiconductor device of claim 1, wherein the drift region further comprises a buffer layer portion located vertically between the plurality of compensation regions and a back-side surface of the semiconductor substrate.

12. The semiconductor device of claim 11, wherein a doping concentration within the buffer layer portion differs by less than 10% from a difference between a doping concentration of buffer compensation region portions of two compensation regions and a doping concentration of the buffer portion located laterally between the buffer compensation region portions of the two compensation regions.

13. The semiconductor device of claim 1, wherein the vertical electrical element arrangement is a vertical diode arrangement or a vertical transistor arrangement.

14. The semiconductor device of claim 1, wherein the vertical electrical element arrangement is a vertical transistor arrangement, wherein the plurality of compensation regions extend from a plurality of body regions of the vertical transistor arrangement into the semiconductor substrate.

15. The semiconductor device of claim 14, further comprising a plurality of source regions of the vertical transistor arrangement, wherein the plurality of source regions and the plurality of body regions are electrically connected to a source wiring structure.

16. The semiconductor device of claim 1, wherein the vertical electrical element arrangement comprises a blocking voltage of more than 100V.

17. A semiconductor device, comprising:
a plurality of compensation regions of a first conductivity type arranged in a semiconductor substrate;
a plurality of drift region portions of a drift region of a vertical electrical element arrangement, the drift region comprising a second conductivity type,
wherein the drift region portions and the compensation regions are arranged alternatingly,
wherein at least two of the compensation regions comprise an upper compensation region portion and a buffer compensation region portion,
wherein the drift region comprises a buffer portion located laterally between the buffer compensation region portion of the at least two compensation regions,
wherein half of a laterally summed number of dopants of the buffer compensation region portion of the at least two compensation regions is lower than 80% of a laterally summed number of dopants of the buffer portion.

18. The semiconductor device of claim 1, wherein a doping concentration of the drift region portions is less than a doping concentration of the drift region.

19. The semiconductor device of claim 17, wherein a doping concentration of the drift region portions is less than a doping concentration of the drift region.

* * * * *